(12) United States Patent
Tsao

(10) Patent No.: US 8,969,997 B2
(45) Date of Patent: Mar. 3, 2015

(54) ISOLATION STRUCTURES AND METHODS OF FORMING THE SAME

(71) Applicant: Taiwan Semiconductor Manufacturing Company, Ltd., Hsinchu (TW)

(72) Inventor: Chang-Sheng Tsao, Taipei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 129 days.

(21) Appl. No.: 13/676,434

(22) Filed: Nov. 14, 2012

(65) Prior Publication Data

US 2014/0131829 A1    May 15, 2014

(51) Int. Cl.
*H01L 31/04* (2014.01)

(52) U.S. Cl.
CPC *H01L 31/04* (2013.01); *Y02E 10/50* (2013.01)
USPC ........... 257/499; 257/315; 257/317; 257/321; 257/E21.546; 257/E21.57; 438/57; 438/70; 438/423; 438/637

(58) Field of Classification Search
USPC ............. 438/57, 70, 423, 637, 740, 138, 187; 257/499, 315, 317, 321, E21.546, 257/E21.57
See application file for complete search history.

(56) References Cited

U.S. PATENT DOCUMENTS

2009/0203186 A1* 8/2009 Sakagami ............. 438/423
2011/0269259 A1* 11/2011 Tatani et al. ............ 438/73

OTHER PUBLICATIONS

Mosher, Lance, et al., "Double-Exposure Grayscale Photolithography", Journal of Microelectromechanical Systems, vol. 18, No. 2, Apr. 2009, pp. 308-315.

* cited by examiner

*Primary Examiner* — Cathy N Lam
(74) *Attorney, Agent, or Firm* — Lowe Hauptman & Ham, LLP

(57) ABSTRACT

A method of forming of a semiconductor structure has isolation structures. A substrate having a first region and a second region is provided. The first region and the second region are implanted with neutral dopants to form a first etching stop feature and a second stop feature in the first region and the second region, respectively. The first etching stop feature has a depth $D_1$ and the second etching stop feature has a depth $D_2$. $D_1$ is less than $D_2$. The substrate in the first region and the second region are etched to form a first trench and a second trench respectively. The first trench and the second trench land on the first etching stop feature and the second etching stop feature, respectively.

20 Claims, 5 Drawing Sheets

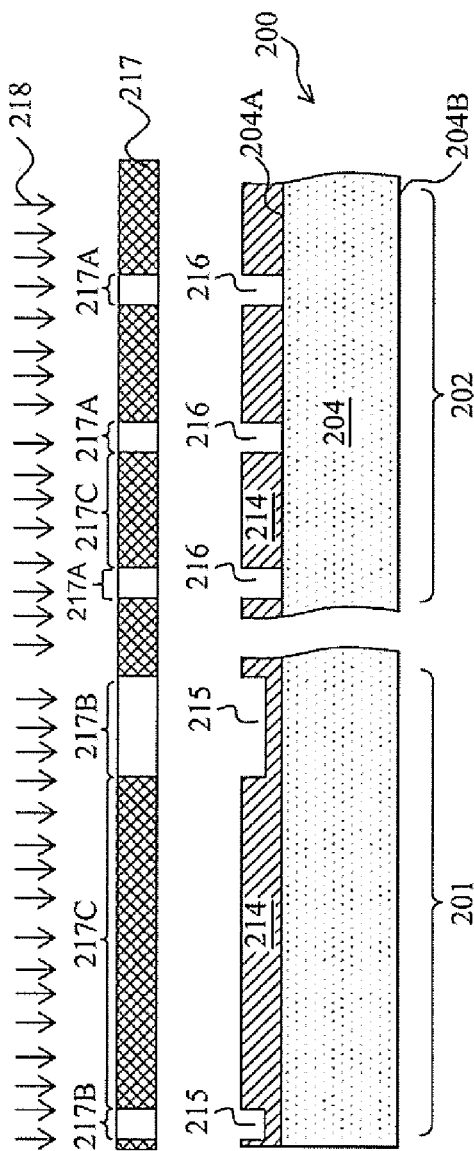
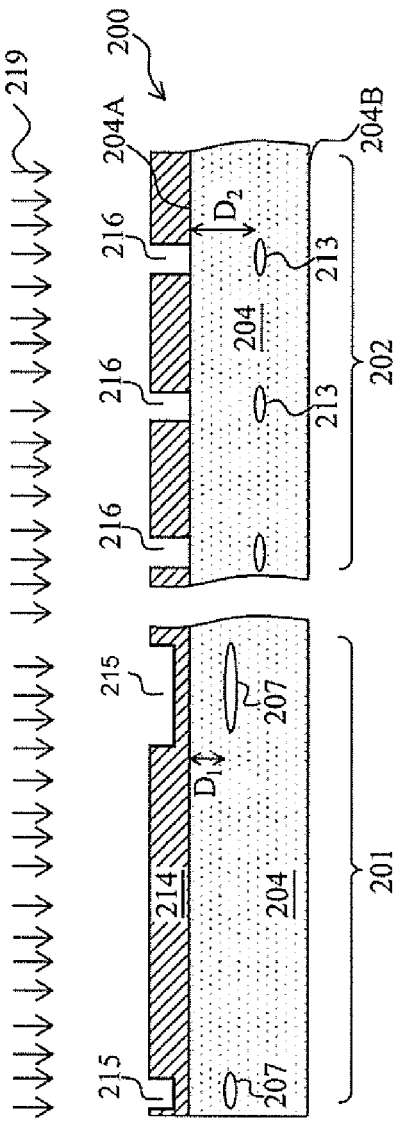
Fig. 2C
Fig. 2D

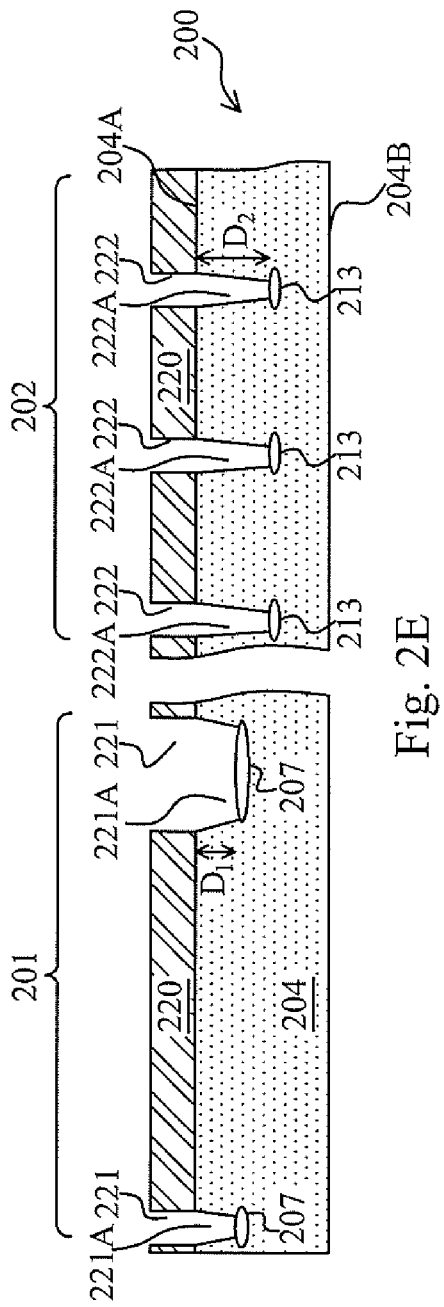
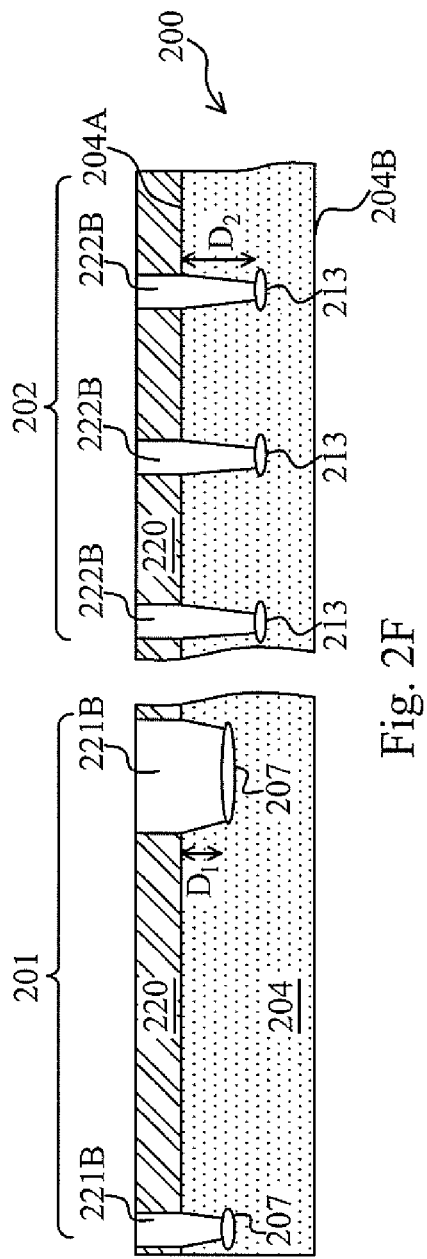
Fig. 2E
Fig. 2F

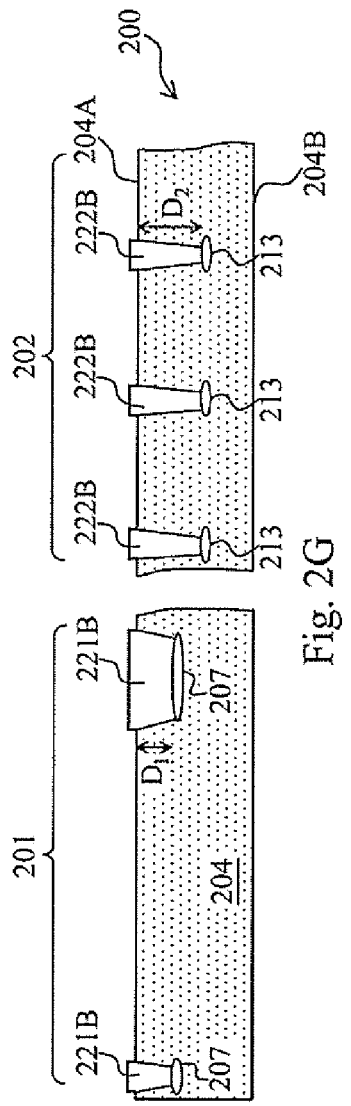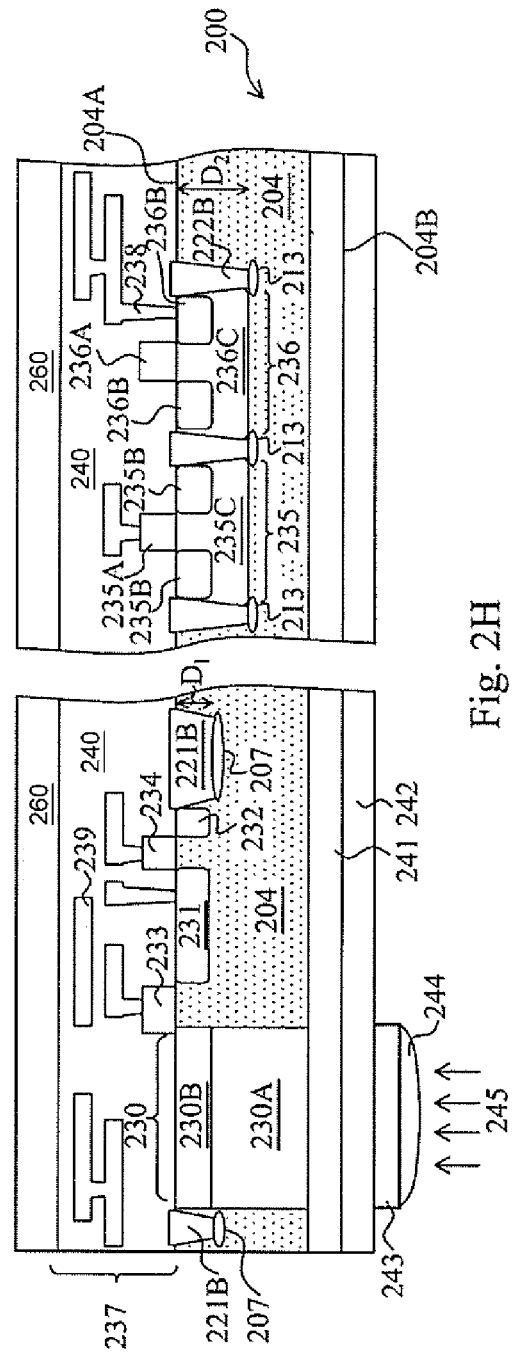

ISOLATION STRUCTURES AND METHODS OF FORMING THE SAME

TECHNICAL FIELD

This disclosure relates to a semiconductor structure having isolation structures and methods of forming a semiconductor structure having isolation structures.

BACKGROUND

Generally, shallow trench isolations (STIs) are used to separate and isolate active areas on a semiconductor wafer from each other. These STIs have historically been formed by etching trenches, overfilling the trenches with a dielectric material such as an oxide, and then removing any excess oxide with a process such as chemical mechanical polishing (CMP) or etching in order to remove the dielectric material outside the trenches. This dielectric material helps to electrically isolate the active areas from each other.

Integrated circuit (IC) technologies are constantly being improved. Such improvements frequently involve scaling down device geometries to achieve lower fabrication costs, higher device integration density, higher speeds, and better performance. Along with the advantages realized from reducing geometry size, improvements are being made directly to the IC devices.

Due to device scaling, improvements to IC devices are continually being made to further improve STIs. Although existing STIs and methods of fabricating STIs have been generally adequate for their intended purposes, as device scaling down continues, they have not been entirely satisfactory in all respects.

BRIEF DESCRIPTION OF THE DRAWINGS

Aspects of the present disclosure may be understood from the following detailed description and the accompanying figures. It is emphasized that, in accordance with the standard practice in the industry, various features are not drawn to scale. In fact, the dimensions of the various features may be arbitrarily increased or reduced for clarity of discussion.

FIGS. 2A to 2H are cross-sectional views of the semiconductor structure having isolation structures at various stages of manufacture according to various embodiments of the method of FIG. 1.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure. Further still, references to relative terms such as "top," "front," "bottom," and "back" are used to provide a relative relationship between elements and are not intended to imply any absolute direction. Various features may be arbitrarily drawn in different scales for simplicity and clarity.

According to one or more embodiments of this disclosure, a semiconductor structure includes isolation structures. Each isolation structure extends from a front surface into a substrate. Each isolation structure has a corresponding etching stop feature embedded in the substrate under each isolation structure. By applying different depths of the etching stop features in the substrate, the depths of the corresponding isolation structures are altered.

According to one or more embodiments of this disclosure, the semiconductor structure having isolation structures is formed within a chip region of the substrate. A plurality of semiconductor chip regions is marked on the substrate by scribe lines between the chip regions. The substrate will go through a variety of cleaning, layering, patterning, etching and doping steps to form device structures. The term "substrate" herein generally refers to a bulk substrate on which various layers and device structures are formed. In some embodiments, the bulk substrate includes silicon or a compound semiconductor, such as GaAs, InP, Si/Ge, or SiC. Examples of the layers include dielectric layers, doped layers, polysilicon layers or conductive layers. Examples of the device structures include transistors, resistors, and/or capacitors, which may be interconnected through an interconnect layer to additional integrated circuits.

Figure 1:
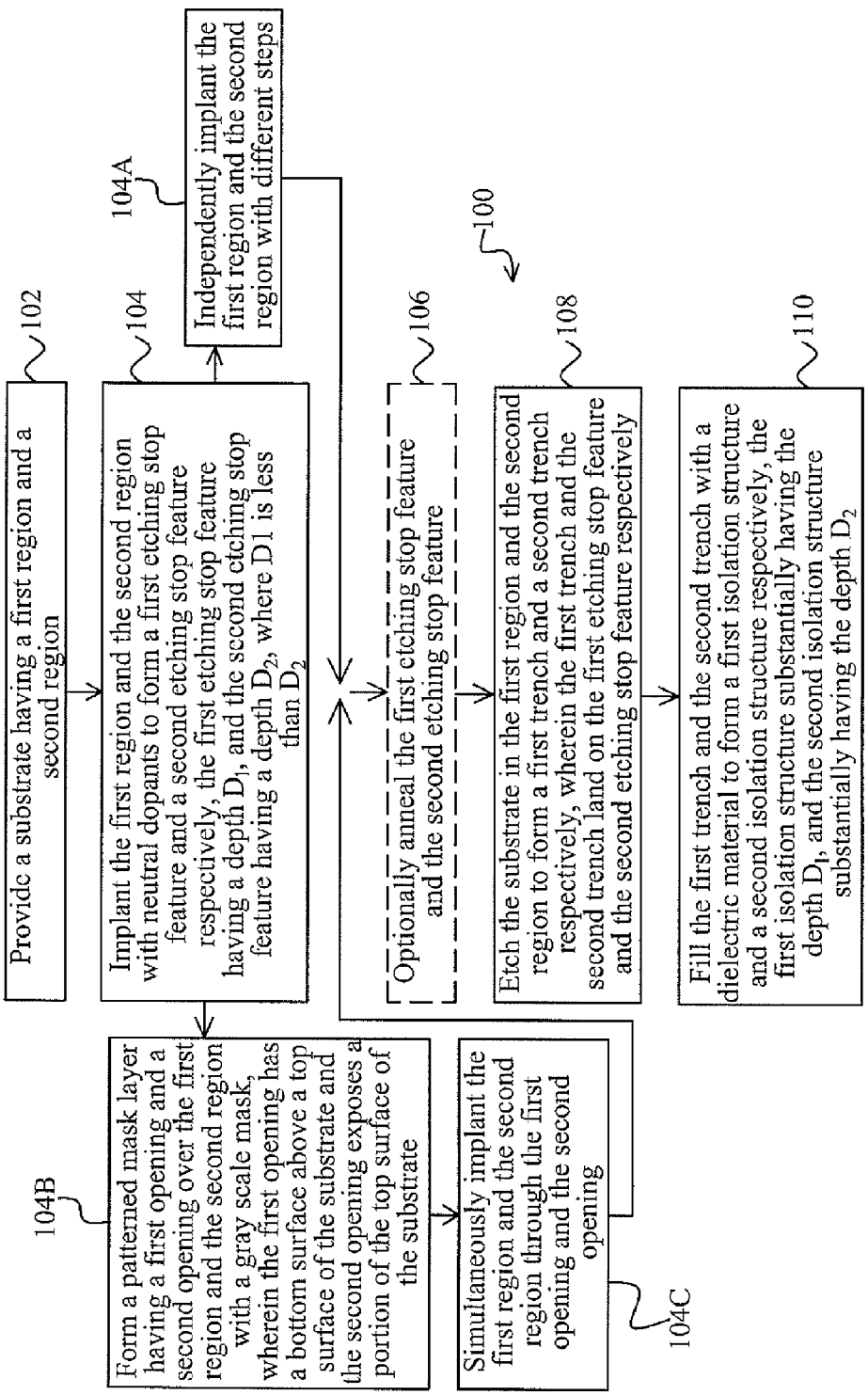
FIG. 1 is a flowchart of a method of forming a semiconductor structure having isolation structures according to one or more embodiments of this disclosure.

FIG. 1 is a flowchart of a method 100 of forming a semiconductor structure having isolation structures according to at least one embodiment of this disclosure. FIGS. 2A to 2H are cross-sectional views of a semiconductor structure 200 having isolation structures at various stages of manufacture according to various embodiments of the method 100 of FIG. 1. Additional processes may be provided before, during, or after the method 100 of FIG. 1. Various figures have been simplified for a better understanding of the inventive concepts of the present disclosure.

Referring now to FIG. 1, the flowchart of the method 100 begins with operations 102 and 104. In operation 102, a substrate having a first region and a second region is provided. In operation 104, the first region and the second region are implanted with neutral dopants to form a first etching stop feature and a second etching stop feature in the first region and the second region, respectively. The first etching stop feature has a depth $D_1$ and the second etching stop feature has a depth $D_2$. $D_1$ is less than $D_2$. In at least one embodiment, operation 104 comprises operation 104A. In operation 104A, the first region and the second region are independently implanted with different steps.

In some embodiments, operation 104 comprises operations 104B and 104C. In operation 104B, a patterned mask layer having a first opening and a second opening is formed over the first region and the second region of the substrate with a gray scale mask. The first opening has a bottom surface above a top surface of the substrate and the second opening exposes a portion of the top surface of the substrate. In operation 104C, the first region and the second region are simultaneously implanted through the first opening and the second opening, respectively.

Figure 2A:
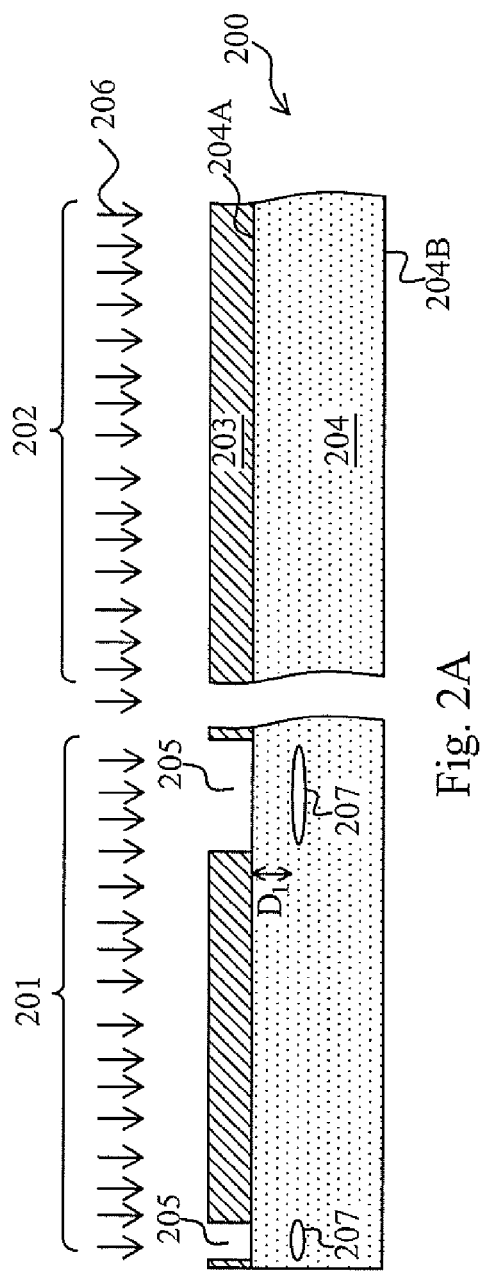
Figure 2B:
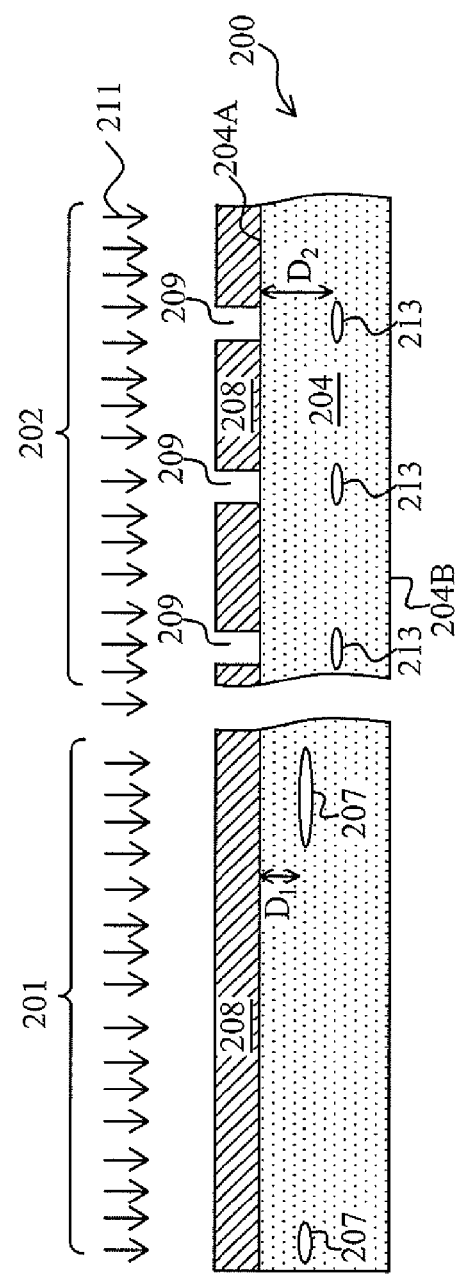

FIGS. 2A and 2B are cross-sectional views of the semiconductor structure 200 after performing operations 102 and 104A. A substrate 204 has a front surface 204A and a back surface 204B. The substrate 204 includes a first region 201 and a second region 202. The substrate 204 is a semiconductor substrate including silicon. In the depicted embodiment, the substrate 204 is a p-type silicon substrate. P-type dopants that the substrate 204 is doped with include boron, gallium, indium, other suitable p-type dopants, or combinations thereof. In some embodiments, the substrate 204 includes suitable materials mentioned above.

In FIG. 2A, a mask layer 203 is formed over the front surface 204A of the substrate 204. In the depicted embodiment, the mask layer 203 includes a photo resist layer. The mask layer 203 is patterned through suitable photolithographic processes to form a plurality of holes 205 and expose a portion of the front surface 204A of the substrate 204 in the first region 201. In some embodiments, the mask layer 203 is a hard mask layer including a dielectric material. The dielectric material comprising a nitrogen-containing material, such as silicon nitride or silicon oxynitride. Alternatively, the dielectric material includes an amorphous carbon material, silicon carbide or tetraethylorthosilicate (TEOS).

A first implantation process 206 is performed through the holes 205 to form first etching stop features 207 in the first region 201. Each of the first etching stop features 207 has a depth $D_1$ from the front surface 204A of the substrate 204. The depth $D_1$ is in a range of about 1000 Å to about 1500 Å. The first implantation process 206 is performed with neutral dopants including oxygen, nitrogen, combinations thereof or other suitable neutral dopants. A dosage used for the dopants is in a range from about $1 \times 10^{12}$ atoms/cm² to about $1 \times 10^{16}$ atoms/cm². An operation energy for the first implantation process 206 is in a range from about 100 KeV to about 2000 KeV. The mask layer 203 is removed after the first implantation process 206.

In FIG. 2B, a mask layer 208 is formed over the front surface 204A of the substrate 204. In the depicted embodiment, the mask layer 208 includes a photo resist layer. The mask layer 208 is patterned through suitable photolithographic processes to form a plurality of holes 209 and expose a portion of the front surface 204A of the substrate 204 in the second region 202. In some embodiments, the mask layer 208 is a hard mask layer including a dielectric material as described in the mask layer 203.

A second implantation process 211 is performed through the holes 209 to form second etching stop features 213 in the second region 202. Each of the second etching stop features 213 has a depth $D_2$ from the front surface 204A of the substrate 204. The depth $D_2$ is greater than the depth $D_1$. The depth $D_2$ is in a range of about 2000 Å to about 3500 Å. The second implantation process 211 is performed with neutral dopants including oxygen, nitrogen, combinations thereof, or other suitable neutral dopants. A dosage used for the dopants is in a range from about $1 \times 10^{12}$ atoms/cm² to about $1 \times 10^{16}$ atoms/cm². An operation energy for the second implantation process 211 is higher than the operation energy for the first implantation process 206 and is within a range from about 100 KeV to about 2000 KeV. The mask layer 208 is removed after the second implantation process 211. In the depicted embodiment, the first implantation process 206 and the second implantation process 211 use the same neutral dopants. In some embodiments, the first implantation process 206 and the second implantation process 211 use different neutral dopants. Each of the first etching stop features 207 and the second etching stop features 213 has a thickness in a range from about 200 Å to about 2000 Å.

FIGS. 2C and 2D are cross-sectional views of the semiconductor structure 200 after performing operations 102, 104B and 104C. In FIG. 2C, a lithography patterning process is performed over the substrate 201. The lithography patterning process includes photoresist coating, soft baking, mask aligning, exposure, post-exposure baking, developing the photoresist, rinsing, drying or combinations thereof. In photoresist coating, a photo resist layer 214 is formed over the front surface 204A of the substrate 204. In mask aligning, a gray scale photomask 217 having a mask pattern is positioned above the substrate 204 and is aligned with the substrate 204. The mask pattern is designed according to integrated circuit features to be formed on a semiconductor substrate. The gray scale photomask 217 includes transparent areas 217A, semi-transparent areas 217B and non-transparent areas 217C to construct the mask pattern. During exposure, the transparent areas 217A allow a radiation beam 218 traveling through the gray scale photomask 217 to the underlying photo resist layer 214 on the substrate 204. The semi-transparent areas 217B block a portion of the radiation beam 218 traveling through of the gray scale photomask 217 to the underlying photo resist layer 214 on the substrate 204. The non-transparent areas 217C block the radiation beam 218 from propagating to the underlying photo resist layer 214.

In developing the photoresist, integrated circuit features in the gray scale photomask 217 are transferred to the underlying photo resist layer 214 on the substrate 204. In the depicted embodiment, the patterned photo resist layer 214 is formed after the lithography patterning process. The patterned photo resist layer 214 has first openings 215 and second openings 216 over the first region 201 and the second region 202 respectively. The first openings 215 correspond to the semi-transparent areas 217B in the gray scale photomask 217. The second openings 216 correspond to the transparent areas 217A in the gray scale photomask 217. The first openings 215 have a bottom surface above the top surface 204A of the substrate 204. Under the first openings 215, there are non-developed portions of photo resist layer 214. The second openings 216 expose a portion of the top surface 204A of the substrate 204.

In FIG. 2D, an implantation process 219 is performed simultaneously through the first openings 215 and the second openings 216 of the photo resist layer 214 to form the first etching stop features 207 and the second etching stop features 213 in the first region 201 and the second region 202, respectively. Each of the first etching stop features 207 has a depth $D_1$ from the front surface 204A of the substrate 204. Each of the second etching stop features 213 has a depth $D_2$ from the front surface 204A of the substrate 204. During the implantation process 219, a portion of implantation energy is consumed by non-developed portions of photo resist layer 214 under the first openings 215. The depth $D_1$ of the first etching stop features 207 is less than the depth $D_2$ of the second etching stop features 213. The depth $D_1$ is in a range of about 1000 Å to about 1500 Å. The depth $D_2$ is in a range of about 2000 Å to about 3500 Å. The implantation process 219 is performed with neutral dopants including oxygen, nitrogen, combinations thereof or other suitable neutral dopants. A dosage used for the dopants is in a range from about $1 \times 10^{12}$ atoms/cm² to about $1 \times 10^{16}$ atoms/cm². The photo resist layer 214 is removed after the implantation process 219.

Referring back to FIG. 1, method 100 continues with operation 106. In operation 106, the first etching stop feature and the second etching stop feature are optionally annealed in a thermal process. The thermal process activates the neutral dopants to react with the substrate to further densify the first etching stop features 207 and the second etching stop features 213. The increased density in the first etching stop feature 207 and the second etching stop features 213 may increase the etch stop effectiveness in the later operation 108.

Referring to FIG. 1, method 100 continues with operation 108. In operation 108, the substrate in the first region and the second region are etched to form a first trench and a second trench respectively. The first trench and the second trench land on the first etching stop feature and the second etching stop feature respectively.

FIG. 2E is a cross-sectional view of the semiconductor structure 200 after performing operation 108. A mask layer 220 is formed over the front surface 204A of the substrate 204. The mask layer 220 includes a photo resist layer, a hard mask layer, or combinations thereof. The mask layer 220 is patterned through suitable photolithographic and/or etching processes to form a plurality of holes 221 and holes 222 to expose portions of the front surface 204A of the substrate 204 in the first region 201 and the second region 202, respectively. The holes 221 and holes 222 are substantially aligned with the first etching stop features 207 and the second etching stop features 213 in the substrate 204.

An etching process is performed simultaneously through the holes 221 and holes 222 of the mask layer 200 to remove exposed portions of the substrate 204. First trenches 221A and second trenches 222A are formed in the substrate 204, and extend form the front surface 204A to the first etching stop features 207 and the second etching stop features 213, respectively. In this etching process, the first etching stop features 207 and the second etching stop features 213 have a higher etching resistance to the etchant used in the etching process than the substrate 204. In some embodiments, each of the first etching stop features 207 and the second etching stop features 213 has an etching selectivity relative to the substrate 204 in a range from about 1:10 to about 1:200. In certain embodiments, each of the first etching stop features 207 and the second etching stop features 213 has an etching selectivity to the substrate 204 in a range from about 1:20 to about 1:40. After this etching process, the first trenches 221A and second trenches 222A land on the first etching stop features 207 and the second etching stop features 213, respectively. The first trench 221A substantially has the depth $D_1$ and the second trench 222A substantially has the depth $D_2$. The depth of a trench is dependent on the depth of a corresponding etching stop feature. Advantageously, different depths of the trenches would be generated through single etching process to etch the substrate 204.

Referring back to FIG. 1, method 100 continues with operation 110. In operation 110, the first trench and the second trench are filled with a dielectric material to form a first isolation structure and a second isolation structure. The first isolation structure substantially has the depth $D_1$ and the second isolation structure substantially has the depth $D_2$.

FIG. 2F is a cross-sectional view of the semiconductor structure 200 after performing operation 110. In at least one embodiment, a dielectric material is formed overfilling each first trench 221A, each hole 221, each second trench 222A and each hole 222. A planarization process, such as a chemical mechanical polishing (CMP) process and/or an etching process, is applied to the dielectric material to reduce a thickness of the dielectric material to expose a top surface of the mask layer 220. A plurality of first isolation structures 221B are formed in the corresponding first trenches 221A and holes 221 in the first region 201. A plurality of second isolation structures 222B are formed in the corresponding second trenches 222A and holes 222 in the second region 202. The first isolation features 221B having substantially the same depth $D_1$ as the first etching stop features 207 to electrically isolate various regions in the substrate 204. Likewise, the second isolation features 222B have substantially the same depth $D_2$ as the second etching stop features 213.

FIG. 2G is a cross-sectional view of the semiconductor structure 200 after removing the mask layer 220. In at least one embodiment, the semiconductor structure 200 is dipped in a first solution, for example a diluted HF solution, to further reduce a height of each isolation structures (221A and 222B) above the front surface 204A of the substrate 204. Next, the semiconductor structure 200 is dipped in a second solution, for example a phosphoric acid solution, to remove the mask layer 220 form the substrate 204.

It is understood by those skilled in the art that the depth of isolation structure may vary between different regions in the same chip dependent on the electrical purposes. The embodiments of the disclosure provide methods to form isolation structures having different depths that achieve different demands for different regions with robust electrical performance.

It is understood that additional steps can be provided before, during, and after the operation 110 of the method 100. For example, FIG. 2H is a cross-sectional view of the semiconductor structure 200 having an image sensor device after the operation 110. At least one photodetector 230 is formed in the first region 201 (also referred as a pixel region 201) adjacent to the first isolation structures 221B. The photodetector 230 includes a light-sensing region 230A and a pinned layer 230B. In the depicted embodiment, the light-sensing region 230A is doped with n-type species along the front surface 204A of the substrate 204. The pinned layer 230B is doped with p-type species overlapping the light-sensing region 230A at the front surface 204A of the substrate 204. A floating diffusion region 231 and a source/drain region 232 are formed in the pixel region 201. In the depicted embodiment, the floating diffusion region 231 is an n-type doped region. The floating diffusion region 231 may convert the accumulated charges from the photodetector 230 to voltage signals for recording an intensity or brightness of light (radiation).

In the second region 202 (also referred as a periphery region 102), an n-type well 235C and a p-well 236C are formed in the substrate 204 by implantations. Source/drain regions 235B and source/drain regions 236B are formed in the corresponding n-type well 235C and p-well 236C by implantations. The n-type well 235C and the p-well 236C adjacent to and isolated by the second isolation structures 222B.

A plurality of gate stacks 233, 234, 235A and 236A are formed on the front surface 204A of the substrate 204. The gate stack 233 corresponds to a transfer transistor overlying a portion of the photodetector 230 in the pixel region 201. The gate stack 234 corresponds to a reset transistor in the pixel region 201. The gate stacks 235A and 236A correspond to the n-type well 235C and the p-well 236C in the periphery region 202. The gate stack 235A and source/drain regions 235B in the n-type well 235C construct a PMOS transistor. Likewise, the gate stack 236A and source/drain regions 236B in the p-type well 236C construct a NMOS transistor. The PMOS transistor and the NMOS transistor in the periphery region 202 may be coupled to the photodetector 230 to provide an operation environment for the pixel region 201 and support external communications with the pixel region 201.

The semiconductor structure 200 further includes a multi-layer interconnect (MLI) 237 disposed over the front surface 204A of the substrate 204. The MLI 237 is coupled to various components of the semiconductor structure 200, such as the photodetector 230, such that the various components of the image sensor device are operable to properly respond to illuminated light (imaging radiation). The MLI 237 includes various conductive features, which may be vertical interconnects, such as contacts and/or vias 238, and horizontal interconnects, such as lines 239. The conductive features 238 and 239 are formed by suitable process, including deposition, lithography patterning, and etching processes to form vertical and horizontal interconnects.

The various conductive features 238 and 239 of the MLI 237 are disposed in an interlayer dielectric (ILD) layer 240. The ILD layer 240 may include silicon dioxide, silicon nitride, silicon oxynitride, TEOS oxide, phosphosilicate glass (PSG), borophosphosilicate glass (BPSG), fluorinated silica glass (FSG), carbon doped silicon oxide, low-k dielectric material, or combinations thereof.

In some embodiments, further process steps are included after the MLI 237 formation. As illustrated in FIG. 2H, a carrier wafer 260 is bonded to the MLI 237. The carrier wafer 260 provides mechanical strength and support for processing the back surface 204B of the substrate 204. A planarization process, such as a chemical mechanical polishing (CMP) process, is applied to the back surface 204B of the substrate 204 to reduce a thickness of the substrate 204. A doped layer 241 is formed by an implantation process, diffusion process, annealing process or combinations thereof through the back surface 204B. The doped layer 241 may repair the back surface 204B from damage caused during the planarization process, and reduce dark current and white pixels. An antireflective layer 242, a color filter 243 and a lens 244 are disposed over the back surface 204B of the substrate 204, in some embodiments. The color filter 243 and the lens 244 are aligned with the light-sensing region 230A of the photodetector 230. The photodetector 230 in the pixel region 201 is capable of converting electromagnetic radiation 245 emitted toward the back surface 204B of the substrate 204 into an electrical signal.

Various embodiments of the present disclosure may be used to improve the performance of a semiconductor structure. For example, different depths of the trenches are generated through single etching process to etch the substrate 204 in operation 108. Furthermore, the first trenches 221A in the first region 201 have the depth $D_1$ less the depth $D_2$ of the second trenches 222A in the second region 102. In forming the first trenches 221A of the corresponding first isolation features 221B, the first region 201 (the pixel region 201) suffers less etching damage than the second region 202 (the periphery region 202) experiences during formation of an image sensor device. A pixel region of an image sensor device is very sensitive to etching damage in converting an electromagnetic radiation into an electrical signal. With less etching damages, this disclosure reduces dark current or reduces white pixel defects of the image sensor device.

One aspect of the disclosure describes a method of forming a semiconductor structure having isolation structures. A substrate has a first region and a second region. The first region and the second region are implanted with neutral dopants to form a first etching stop feature and a second stop feature in the first region and the second region, respectively. The first etching stop feature has a depth $D_1$ and the second etching stop feature has a depth $D_2$. $D_1$ is less than $D_2$. The substrate in the first region and the second region are etched to form a first trench and a second trench, respectively. The first trench and the second trench land on the first etching stop feature and the second etching stop feature, respectively. The first trench and the second trench are filled with a dielectric material to form a first isolation structure and a second isolation structure. The first isolation structure substantially has the depth $D_1$ and the second isolation structure substantially has the depth $D_2$.

A further aspect of the disclosure describes a method of forming a semiconductor structure having isolation structures. A substrate has a front surface and a back surface, and a first region and a second region. The substrate is implanted to form a first etching stop feature and a second stop feature in the first region and the second region respectively. The first etching stop feature has a depth $D_1$ from the front surface and the second etching stop feature has a depth $D_2$ from the front surface. $D_1$ is less than $D_2$. The substrate is etched in the first region and the second region to form a first trench and a second trench respectively. The first etching stop feature and the second etching stop feature have a higher etching resistance than the substrate. The first trench and the second trench are filled with a dielectric material to form a first isolation structure and a second isolation structure. The first isolation structure substantially has the depth $D_1$ and the second isolation structure substantially has the depth $D_2$.

The present disclosure also describes an aspect of a semiconductor structure having isolation structures. A substrate has a front surface and a back surface. A first isolation structure extends from the front surface into the substrate. The first isolation structure has a depth $D_1$ from the front surface. A second isolation structure extends from the front surface into the substrate. The second isolation structure has a depth $D_2$ from the front surface. The depth $D_1$ is less than the depth $D_2$. A first etching stop feature and a second etching stop feature are embedded in the substrate and contact the first isolation structure and the second isolation structure, respectively.

Although the embodiments and its advantages have been described in detail, it should be understood that various changes, substitutions and alterations can be made herein without departing from the spirit and scope of the invention as defined by the appended claims. As one of ordinary skill in the art will readily appreciate from the present disclosure, processes, machines, manufacture, compositions of matter, means, methods, or steps that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed:

1. A method of forming a semiconductor structure having isolation structures, the method comprising:
   providing a substrate having a first region and a second region;
   implanting the first region and the second region with neutral dopants to form a first etching stop feature and a second stop feature in the first region and the second region, respectively, the first etching stop feature having a depth $D_1$, and the second etching stop feature having a depth $D_2$, wherein $D_1$ is less than $D_2$;
   etching the substrate in the first region and the second region to form a first trench and a second trench, respectively, wherein the first trench and the second trench land on the first etching stop feature and the second etching stop feature, respectively; and
   filling the first trench and the second trench with a dielectric material to form a first isolation structure and a second isolation structure, wherein the first isolation structure substantially has the depth $D_1$ and the second isolation structure substantially has the depth $D_2$.

2. The method of claim 1, wherein the neutral dopants include at least one of oxygen or nitrogen.

3. The method of claim 1, wherein each of the first etching stop feature and the second etching stop feature have an etching selectivity relative to the substrate in a range from about 1:10 to about 1:200.

4. The method of claim 3, wherein each of the first etching stop feature and the second etching stop feature have an etching selectivity to the substrate in a range from about 1:20 to about 1:40.

5. The method of claim 1, wherein each of the first etching stop feature and the second etching stop feature have a thickness in a range from about 200 Å to about 2000 Å.

6. The method of claim 1, wherein the step of implanting the first region and the second region comprising:
   independently implanting the first region and the second region with different steps.

7. The method of claim 1, wherein the step of implanting the first region and the second region comprises:
   forming a patterned photo resist layer having a first opening and a second opening over the first region and the second region with a gray scale mask, wherein the first opening has a bottom surface of above a top surface of the substrate and the second opening exposes a portion of the top surface of the substrate; and
   simultaneously implanting the first region and the second region through the first opening and the second opening.

8. The method of claim 1, further comprising:
   annealing the first etching stop feature and the second etching stop feature after the step of implanting the first region and the second region and before the step of etching the substrate in the first region and the second region.

9. The method of claim 1, further comprising:
   forming at least one photodetector in the first region of the substrate adjacent to the first isolation structure.

10. A method of forming a semiconductor structure having isolation structures, the method comprising:
   providing a substrate having a front surface and a back surface, and a first region and a second region;
   implanting the substrate to form a first etching stop feature and a second stop feature in the first region and the second region respectively, the first etching stop feature having a depth $D_1$ from the front surface and the second etching stop feature having a depth $D_2$ from the front surface, wherein $D_1$ is less than $D_2$;
   etching the substrate in the first region and the second region to form a first trench and a second trench, respectively, wherein the first etching stop feature and the second etching stop feature have a higher etching resistance than the substrate; and
   filling the first trench and the second trench with a dielectric material to form a first isolation structure and a second isolation structure, wherein the first isolation structure substantially has the depth $D_1$ and the second isolation structure substantially has the depth $D_2$.

11. The method of claim 10, wherein first etching stop feature and second stop feature include at least one of oxygen or nitrogen.

12. The method of claim 10, wherein each of the first etching stop feature and the second etching stop feature have an etching selectivity relative to the substrate in a range from about 1:10 to about 1:200.

13. The method of claim 10, wherein the step of implanting the first region and the second region comprising:
   independently implanting the first region and the second region with different steps.

14. The method of claim 10, wherein the step of implanting the first region and the second region comprises:
   forming a patterned photo resist layer having a first opening and a second opening over the front surface of the first region and the second region with a gray scale mask, wherein the first opening has a bottom surface of above the front surface of the substrate and the second opening exposes a portion of the front surface of the substrate; and
   simultaneously implanting the first region and the second region through the first opening and the second opening.

15. The method of claim 10, further comprising:
   annealing the first etching stop feature and the second etching stop feature after the step of implanting the first region and the second region and before the step of etching the substrate in the first region and the second region.

16. The method of claim 10, further comprising:
   forming at least one photodetector in the first region of the substrate adjacent to the first isolation structure; and
   thinning the substrate from the back surface to form a backside illuminated image (BSI) sensor device.

17. The method of claim 16, further comprising:
   forming a color filter and a lens over the back surface of the substrate, wherein the color filter and the lens are aligned with the at least one photodetector.

18. A semiconductor structure having isolation structures, comprising:
   a substrate having a front surface and a back surface;
   a first isolation structure extending from the front surface into the substrate, the first isolation structure having a depth $D_1$ from the front surface;
   a second isolation structure extending from the front surface into the substrate, the second isolation structure having a depth $D_2$ from the front surface, wherein the depth $D_1$ is less than the depth $D_2$; and
   a first etching stop feature and a second etching stop feature embedded in the substrate and contacting the first isolation structure and the second isolation structure, respectively.

19. The semiconductor structure of claim 18, wherein first etching stop feature and second stop feature include at least one of oxygen or nitrogen.

20. The semiconductor structure of claim 18, wherein each of the first etching stop feature and the second etching stop feature have an etching selectivity relative to the substrate in a range from about 1:10 to about 1:200.

* * * * *